US010535491B2

(12) United States Patent
Rommel et al.

(10) Patent No.: US 10,535,491 B2
(45) Date of Patent: Jan. 14, 2020

(54) DYNAMICALLY ADJUSTABLE FOCAL SPOT

(71) Applicant: American Science and Engineering, Inc., Billerica, MA (US)

(72) Inventors: Martin Rommel, Lexington, MA (US); Louis P. Wainwright, Lynnfield, MA (US)

(73) Assignee: American Science and Engineering, Inc., Billerica, MA (US)

( * ) Notice: Subject to any disclaimer, the term of this patent is extended or adjusted under 35 U.S.C. 154(b) by 179 days.

(21) Appl. No.: 15/544,177

(22) PCT Filed: Dec. 18, 2015

(86) PCT No.: PCT/US2015/066603
§ 371 (c)(1),
(2) Date: Jul. 17, 2017

(87) PCT Pub. No.: WO2016/118271
PCT Pub. Date: Jul. 28, 2016

(65) Prior Publication Data
US 2018/0012724 A1 Jan. 11, 2018

Related U.S. Application Data

(60) Provisional application No. 62/105,474, filed on Jan. 20, 2015.

(51) Int. Cl.
*H01L 35/30* (2006.01)
*H01J 35/14* (2006.01)
(Continued)

(52) U.S. Cl.
CPC .............. *H01J 35/30* (2013.01); *H01J 35/14* (2013.01); *G21K 1/02* (2013.01)

(58) Field of Classification Search
CPC .. H01J 35/14; H01J 35/30; H01J 37/04; H01J 37/05; G21K 1/02
See application file for complete search history.

(56) References Cited

U.S. PATENT DOCUMENTS 4,045,672 A 8/1977 Watanabe
4,352,021 A 9/1982 Boyd
(Continued)

FOREIGN PATENT DOCUMENTS

EP 1213743 A2 6/2002
WO 2008155695 A1 12/2008

OTHER PUBLICATIONS

Orloff, Jon "Handbook of Charged Particle Optics, Second Edition" CRC Press, Taylor & Francis Group LLC, 2009.

*Primary Examiner* — David P Porta
*Assistant Examiner* — Fani Boosalis
(74) *Attorney, Agent, or Firm* — Novel IP

(57) ABSTRACT

Methods for maintaining a specified beam profile of an x-ray beam extracted from an x-ray target over a large range of extraction angles relative to the target. A beam of electrons is generated and directed toward a target at an angle of incidence with respect to the target, with the beam of electrons forming a focal spot corresponding to the cross-section of the electron beam. At least one of a size, shape, and orientation of the electron beam cross-section is dynamically varied as the extraction angle is varied, and the extracted x-ray beam is collimated. Dynamically varying the size, shape or orientation of the electron beam cross-section may be performed using focusing and stigmator coils.

18 Claims, 6 Drawing Sheets

(51) Int. Cl.
*G21K 1/02* (2006.01)
*H01J 35/30* (2006.01)

(56) References Cited

U.S. PATENT DOCUMENTS

| | | | |
|---|---|---|---|
| 4,658,408 | A | 4/1987 | Amor |
| 4,745,631 | A | 5/1988 | Paolini |
| 4,995,066 | A | 2/1991 | Harding |
| 5,038,370 | A | 8/1991 | Harding |
| 5,065,418 | A | 11/1991 | Bermbach |
| 5,197,088 | A | 3/1993 | Vincent |
| 5,259,012 | A | 11/1993 | Baker |
| 5,491,734 | A | 2/1996 | Boyd |
| 5,493,596 | A | 2/1996 | Annis |
| 5,504,791 | A | 4/1996 | Hell |
| 5,508,515 | A | 4/1996 | Enge |
| 5,818,054 | A | 10/1998 | Randers-Pehrson |
| 5,822,395 | A | 10/1998 | Schardt |
| 6,151,381 | A | 11/2000 | Grodzins |
| 6,192,104 | B1 | 2/2001 | Adams |
| 6,272,206 | B1 | 8/2001 | Bjorkholm |
| 6,339,635 | B1 | 1/2002 | Schardt |
| 6,421,420 | B1 | 7/2002 | Grodzins |
| 6,434,219 | B1 | 8/2002 | Rothschild |
| 6,453,007 | B2 | 9/2002 | Adams |
| 7,233,644 | B1 | 6/2007 | Bendahan |
| 7,529,343 | B2 | 5/2009 | Safai |
| 8,576,989 | B2 | 11/2013 | Kaminski |
| 9,058,909 | B2 | 6/2015 | Kaminski |
| 9,086,497 | B2 | 7/2015 | Bendahan |
| 9,117,564 | B2 | 8/2015 | Rommel |
| 9,257,208 | B2 | 2/2016 | Rommel |
| 9,291,582 | B2 | 3/2016 | Grodzins |
| 9,442,213 | B2 | 9/2016 | Bendahan |
| 9,466,456 | B2 | 10/2016 | Rommel |
| 2002/0094064 | A1 | 7/2002 | Zhou |
| 2004/0022361 | A1 | 2/2004 | Lemaitre |
| 2004/0081269 | A1 | 4/2004 | Pan |
| 2004/0109532 | A1 | 6/2004 | Ford |
| 2004/0140438 | A1 | 7/2004 | Gerlach |
| 2005/0117694 | A1 | 6/2005 | Francke |
| 2005/0226364 | A1 | 10/2005 | Bernard |
| 2006/0034426 | A1 | 2/2006 | Freudenberger |
| 2006/0182223 | A1 | 8/2006 | Heuscher |
| 2007/0237293 | A1 | 10/2007 | Singh |
| 2008/0043910 | A1 | 2/2008 | Thomas |
| 2008/0137805 | A1 | 6/2008 | Forster |
| 2008/0304622 | A1 | 12/2008 | Morton |
| 2008/0317208 | A1 * | 12/2008 | Dieter ..................... H01J 35/14 378/137 |
| 2010/0111260 | A1 | 5/2010 | Motz |
| 2010/0127169 | A1 | 5/2010 | Whittum |
| 2011/0103554 | A1 | 5/2011 | Charette |
| 2011/0206179 | A1 | 8/2011 | Bendahan |
| 2012/0321049 | A1 | 12/2012 | Langeveld |
| 2013/0208857 | A1 * | 8/2013 | Arodzero .............. G01T 1/2006 378/57 |
| 2014/0161233 | A1 | 6/2014 | Ollinger |

* cited by examiner

DYNAMICALLY ADJUSTABLE FOCAL SPOT

CROSS REFERENCE

The present application is a 371 National Stage application of PCT/US2015/066603, entitled "Dynamically Adjustable Focal Spot"and filed on Dec. 18, 2015, which claims the priority of U.S. Provisional Patent Application Ser. No. 62/105,474, filed Jan. 20, 2015, both of which are incorporated herein by reference in their entirety.

TECHNICAL FIELD

The present invention relates to x-ray imaging, and more particularly to scanning pencil beam x-ray imaging systems with a dynamically adjusted focal spot for improved imaging with large fields of view.

BACKGROUND OF THE INVENTION

Almost all x-ray imaging systems use x-ray sources in which x-rays are generated when a beam of accelerated electrons impinges upon a target. The kinetic energy of the electrons is mostly converted to heat and only a small fraction to x-rays (referred to, in this context, as bremsstrahlung). Driven by the requirements of spatial resolution in imaging systems, x-ray tubes are designed to focus the electron beam onto a small area on the target. This area is commonly referred to as the tube's focal spot.

Definitions: As used herein, and in any appended claims, the term "x-ray tube" shall refer to any device in which electrons, or any other charged particles, are accelerated toward a target where they generate bremsstrahlung with photons having energies of at least 100 eV.

An x-ray target shall refer to any metal substrate impinged upon by energetic charged particles, for the generation of bremsstrahlung.

The term "x-ray source" shall signify a device that produces x-rays, including, without limitation, x-ray tubes, or bremsstrahlung targets impinged upon by energetic particles, without regard for the mechanism used for acceleration of the particles, including, without limitation, linacs, etc.

As the term is used herein, "focal spot" shall refer to a region on a target of an x-ray source impinged upon by energetic particles at a specified instant of time. Thus, focal spot is a dynamic concept in that it may be made to vary as a function of time.

The term "apparent focal spot" shall mean a projection of the focal spot onto a plane transverse to a direction (referred to herein as the "direction of x-ray extraction") in which an x-ray beam is extracted from the x-ray tube.

As applied herein to a field of view (the cumulative angular extent encompassed by a scanning system), the term "large" shall denote that x-rays are extracted over an angular range larger than 30° to either side of a fiducial central direction.

Focusing electron beam power onto a region of a target which is too small may over-heat the target, resulting in the requirement that the target be cooled. The focal spot size limit is given by the allowable areal power density, which is a design parameter of an x-ray target. In order to decrease the apparent size of the focal spot, and thus increase spatial resolution, the x-ray radiation is typically extracted at a relatively shallow angle from the target surface. Common target angles (also known as "anode heel angles"), range from 20° down to 6°, thereby allowing the focal spot on the target to be about 3 to 10 times larger in area than the apparent focal spot, as defined above.

For a given target angle, the apparent focal spot size is optimized by elongating the actual focal spot on the target along the direction of x-ray extraction by a factor $1/\sin(\alpha)$ where $\alpha$ is the target angle. For imaging applications, the desired shape of the apparent focal spot is typically a square or a circle. A square shape is achieved by creating a rectangular actual focal spot with a side ratio of 1: $\sin(\alpha)$, and the long dimensions aligned with the direction of x-ray extraction. A circular shape is achieved by creating an ellipse with an axes ratio of 1: $\sin(\alpha)$ and the major axis along the direction of the x-ray extraction.

As long as the x-rays are extracted only in one fixed direction, the described prior-art approach works very well. However, imaging systems require the x-ray source to irradiate not only a single direction but a specified field of view, which is typically achieved in one of three principal ways: by using a cone beam, a fan beam, or a pencil beam.

In cone beam systems, a relatively large collimator opening creates the cone beam which irradiates the entire field of view at once. The typically rectangular field of view is spanned by two angles. Typically the smaller of these angles is limited by the target surface on one side (heel effect) and by an increasing apparent focal spot size on the other. The other (orthogonal) angle provides the desired aspect ratio. Both angles typically span less than ±30° and the distortion of the apparent focal spot for off-center angles is limited. Adjustable focal spots have been developed for this type of system allowing focal spot optimization for different fields of view and different beam power requirements. In U.S. Pat. No. 5,822,395, Schardt et al. propose electromagnetically shaping the cross-section of the electron beam to minimize the apparent focal spot distortions for off-center angles for selectable target angles and beam power levels. The shape and size of the focal spot remain fixed during image acquisition.

Fan beam systems cover their field of view by the fan beam opening angle in one dimension and by relative motion in the other. The image is acquired one line at the time. The fan beam is typically created normal to the impinging electron beam and the fan opening angles are often wider than for cone beam systems and can exceed ±45°. The apparent focal spot can be fully optimized only for one extraction angle, normally the center of the fan beam. With increasing off-center angle the apparent focal spot becomes distorted.

Pencil beam systems acquire the image data sequentially, pixel by pixel. The pencil beam scans the imaging object in two dimensions. Most pencil beam systems cover one dimension by relative motion and the other by moving an aperture in front of a stationary x-ray tube. Accordingly, the apparent focal spot suffers the same distortion as for the fan beam system.

Angles associated with bremsstrahlung targets are now described with reference to prior art practice and the resultant beam distortion.

FIG. 1 shows a prior art stationary x-ray tube target 10. The actual focal spot 12 is outlined by the dotted line ellipse 11. Focal spot 12 is the cross-section of an electron beam 16 generated at cathode 17 and impinging on the target 10 from above. Target angle $\alpha$ in the illustration of FIG. 1 is 20°. The angle $\varphi$ spans the fan beam or the scan angle range of the pencil beam. The two arrows 13 and 14 indicate the directions of x-ray extraction for $\varphi=0$ (fan beam center) and $\varphi=60°$, respectively. In particular, arrow 14 serves only as one example for off-center extraction.

FIGS. 2A and 2B show the same prior art target 10 as shown in FIG. 1, with focal spot 12, but oriented so that the $\varphi=0$ (in FIG. 2A) and $\varphi=60°$ (in FIG. 2B) direction are normal to the page. For $\varphi=0$ (in FIG. 2A), the apparent focal spot 20, as viewed from the direction of emitted beam propagation, has the desired circular shape. In the off-center view (FIG. 2B) the apparent focal spot deviates significantly from the ideal circular shape.

FIG. 3 identifies the three angles associated with the distortion of the apparent focal spot: the skew angle $\sigma$, the slant angle $\varepsilon$ of the ellipse, and the slant angle $\delta$ of the diagonal. It should be noted, that all three angles are in the same plane, the image plane of FIG. 3.

FIG. 4 shows the distortion of the apparent focal spot at various angles $\varphi$ for three target angles $\alpha$. Starting with a square shaped apparent focal spot 40 for $\varphi=0$, the apparent focal spot will be skewed and compressed horizontally with increasing angle $\varphi$. The skew angle $\sigma$ of parallelogram 42 is a function of the target angle $\alpha$ and the x-ray extraction angle $\varphi$:

$$\sigma=\arctan[\cot(\alpha)\sin(\varphi)]$$

The horizontal compression factor is simply $\cos(\varphi)$. Note, that the vertical extent remains unchanged. The lengths and slant of the long diagonal d of the parallelogram shaped apparent focal spot depends on the angles $\alpha$ and $\varphi$ according to:

$$d=\sqrt{1+(\cos(\varphi)+\cot(\alpha)\sin(\varphi))^2}$$

Slant angle $\delta$ is larger than the skew angle $\alpha$:

$$\delta=\arctan[\cot(\alpha)\ \sin(\varphi)+\cos(\varphi)].$$

The geometric transformation of the $\varphi=0$ apparent focal spot is given by the matrix m:

$$m=\begin{pmatrix}\cos(\varphi) & \cot(\alpha)\sin(\varphi)\\ 0 & 1\end{pmatrix}$$

For $\varphi>0$ this transformation turns a circular apparent focal spot at $\varphi=0$ into an ellipse. The eccentricity of this ellipse increases with $\varphi$. Its axes and slant angle $\varepsilon$ can be found through Singular Value Decomposition of the matrix m.

FIG. 5 shows how the skew angle $\sigma$, the slant angle $\delta$ of the diagonal, and the slant angle $\varepsilon$ of the ellipse vary with the extraction angle $\varphi$ in case of a 20° target angle $\alpha$. The slant angles of the ellipse's major axis and the parallelogram's diagonal start from 45° at $\varphi=0$. The ellipse's slant angle is always smaller than that of the parallelogram's diagonal and both are always larger than the skew angle $\sigma$ of the parallelogram.

The fact that the minor axis of an elliptical apparent focal spot shrinks as $\varphi$ increases is not detrimental to imaging, but the growing major axis results in reduced spatial resolution. The same is true for the growing diagonal of a parallelogram shaped apparent focal spot.

An approach suggested by Safai et al. in U.S. Pat. No. 7,529,343 requires a rotating x-ray target. That approach may eliminate the distortion of the apparent focal spot, but only as long as the x-ray extraction angle remains aligned with the target and the electron beam cross section is not elongated. An elongated cross-section would result in a spinning apparent focal spot as the target rotates unless the electron-beam cross-section also co-rotates with the target. in which case rotating the entire tube would likely be the simpler implementation. Safai '343 provides no teaching of such a method.

If the electron beam cross-section is not elongated, only a 45° target angle creates a non-elongated apparent focal spot. In this case the actual focal spot is enlarged by merely a factor $\sqrt{2}$ which does not significantly alleviate the power density constraints. All this makes the solution proposed by Safai et al. complex, expensive to implement and inadequate for imaging applications requiring high power densities.

It would thus be advantageous to find a better way to compensate for distortion arising due to selecting target angles that vary over a large field of view, a way which preserves the advantages of small target angles and eschews the complexities of introducing moving parts inside the vacuum tube It would be furthermore advantageous to find a method to compensate for focal spot distortions which is applicable to scanning electron beam x-ray sources, such as for example described by Watanabe in U.S. Pat. No. 4,045,672.

SUMMARY OF EMBODIMENTS OF THE INVENTION

In accordance with embodiments of the present invention, a method is provided for maintaining a specified beam profile of an x-ray beam extracted from an x-ray target over a large range of extraction angles relative to this target. The method has steps of:

- generating a beam of electrons;
- directing the beam of electrons toward a target at an angle of incidence with respect to the target where the impinging electrons form a focal spot corresponding to the cross-section of the electron beam;
- dynamically varying at least one of the size, shape, and orientation of the electron beam cross-section and thus of the focal spot as the extraction angle is varied; and
- collimating the x-ray beam extracted at the extraction angle.

In accordance with alternate embodiments of the invention, the step of dynamically varying at least one of the size, shape, and orientation of the focal spot employs focusing and stigmator coils.

An apparent focal spot may be controlled in size, shape or orientation as a function of the extraction angle.

In further embodiments of the invention, the method may also have steps of varying the angle of incidence of the beam of electrons during generation of x-rays, and/or varying a centroid of the focal spot on the target as a function of time.

In yet another embodiment of the invention, focal spot adjustments may be functionally related to beam deflection.

BRIEF DESCRIPTION OF THE DRAWINGS

The foregoing features of the invention will be more readily understood by reference to the following detailed description, taken with reference to the accompanying drawings, in which.

DETAILED DESCRIPTION OF EMBODIMENTS OF THE INVENTION

Scanning pencil beam systems acquire the image data sequentially, pixel by pixel. That means that, at any given time, x-rays are extracted at one specific angle and not over an entire range. This makes it possible, in accordance with the invention described herein, to correct for the extraction angle dependent distortion of the apparent focal spot.

In accordance with embodiments of the present invention, of particular advantage in the case of a pencil beam system with a wide field of view, the size and shape of apparent focal spot can be maintained over the entire angular scan range by dynamically adjusting the actual focal spot on the target. This can be achieved by controlling the cross-section of the electron beam by means of focusing and stigmator coils. Most importantly, the orientation of the elongated cross-section of the electron beam can be controlled with stigmator coils so that the actual focal spot on the target always aligns with the collimating aperture. In addition, by controlling the focusing the electron beam cross-section can be adjusted so that size and shape of the apparent focal spot do not vary as a function of the x-ray extraction angle φ.

In contrast to Safai's concept, described in the Background Section above, dynamical adjustment of the focal spot in accordance with the present invention may advantageously keep the actual focal spot aligned with a moving aperture without requiring any moving parts inside the vacuum tube. It can be implemented purely electronically by controlling the currents through the stigmator coils.

And, in contradistinction to the teaching of Schardt et al., not only are the actual focal spot shape and size adjusted in accordance with the present invention, but, most importantly, orientation of the focal spot on the target is adjusted as well. Moreover, in accordance with the present invention, focal spot 12 is adjusted in real-time during the image acquisition and not just between images.

Figure 1:
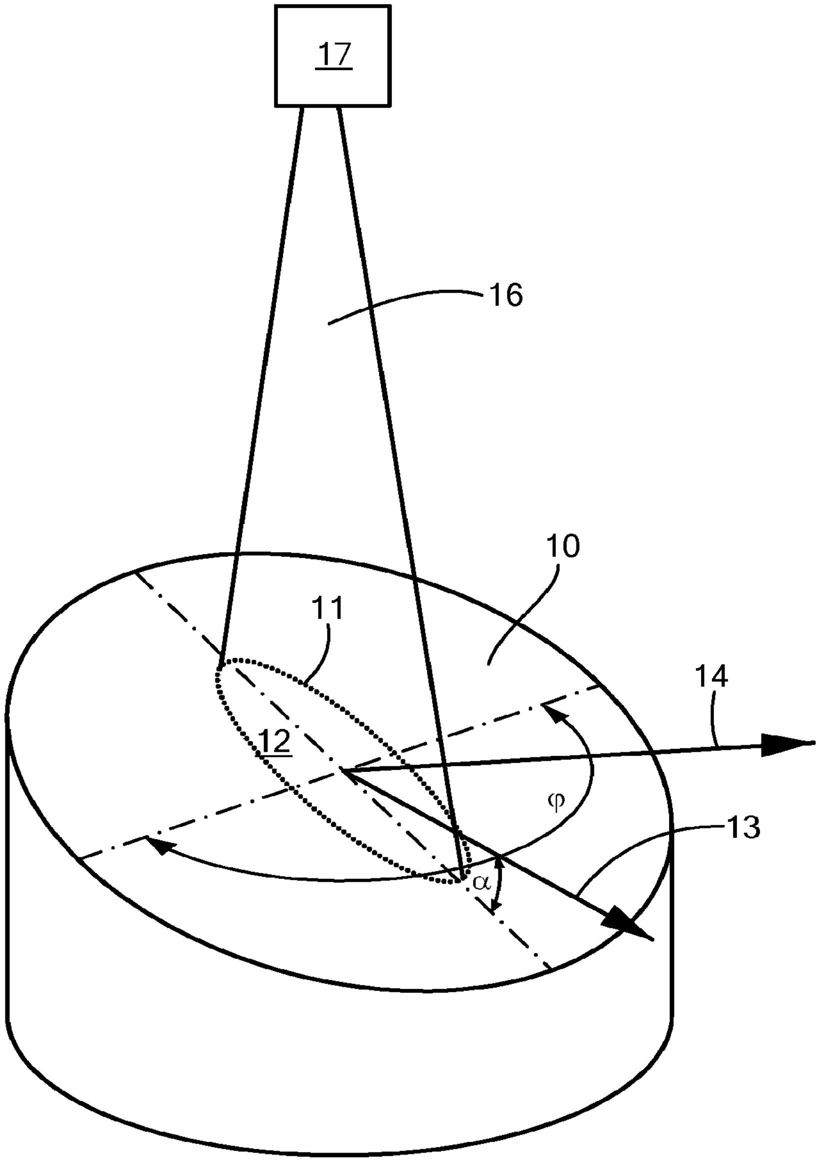
FIG. 1 PRIOR ART
FIG. 1 depicts a prior art stationary x-ray tube target, with a fixed focal spot.
Figure 2A:
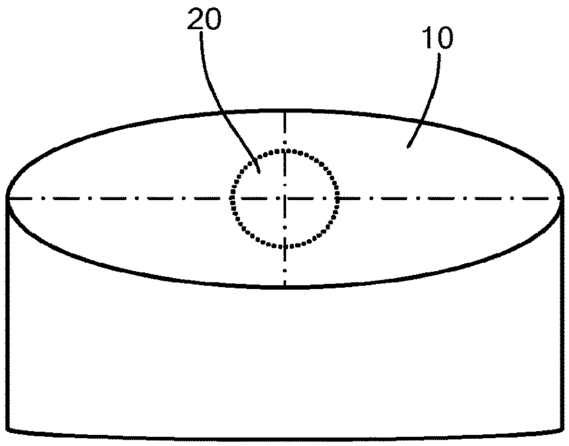
FIG. 2A PRIOR ART
FIGS. 2A and 2B show the prior art target of FIG. 1 oriented so that the $\varphi=0$ (in FIG. 2A) and $\varphi=60°$ (in FIG. 2B) direction are normal to the page, illustrating an apparent focal spot 20 in the respective cases.
Figure 2B:
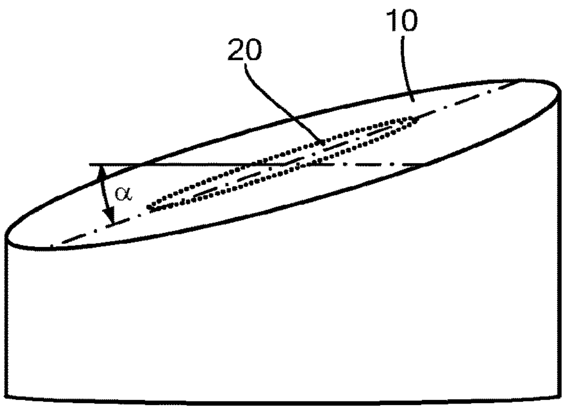
FIG. 2B PRIOR ART
Figure 3:
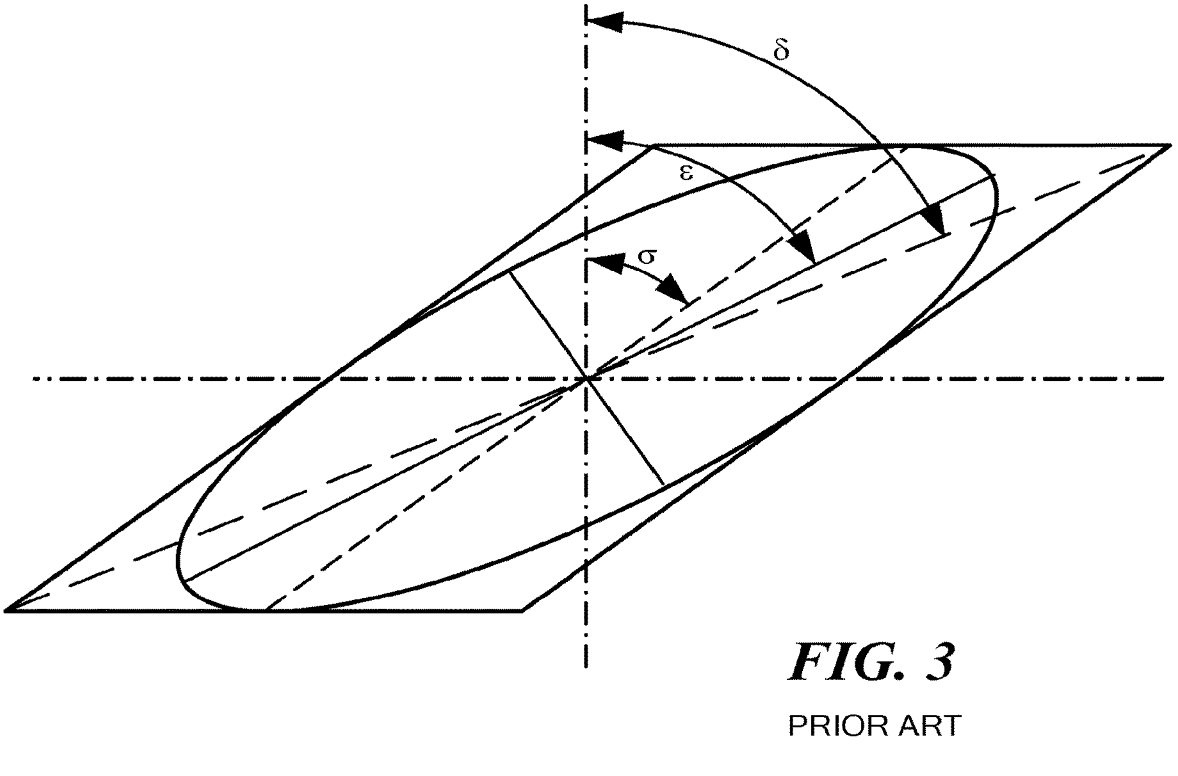
FIG. 3 PRIOR ART
FIG. 3 identifies the three angles associated with distortion of an apparent focal spot.
Figure 4:
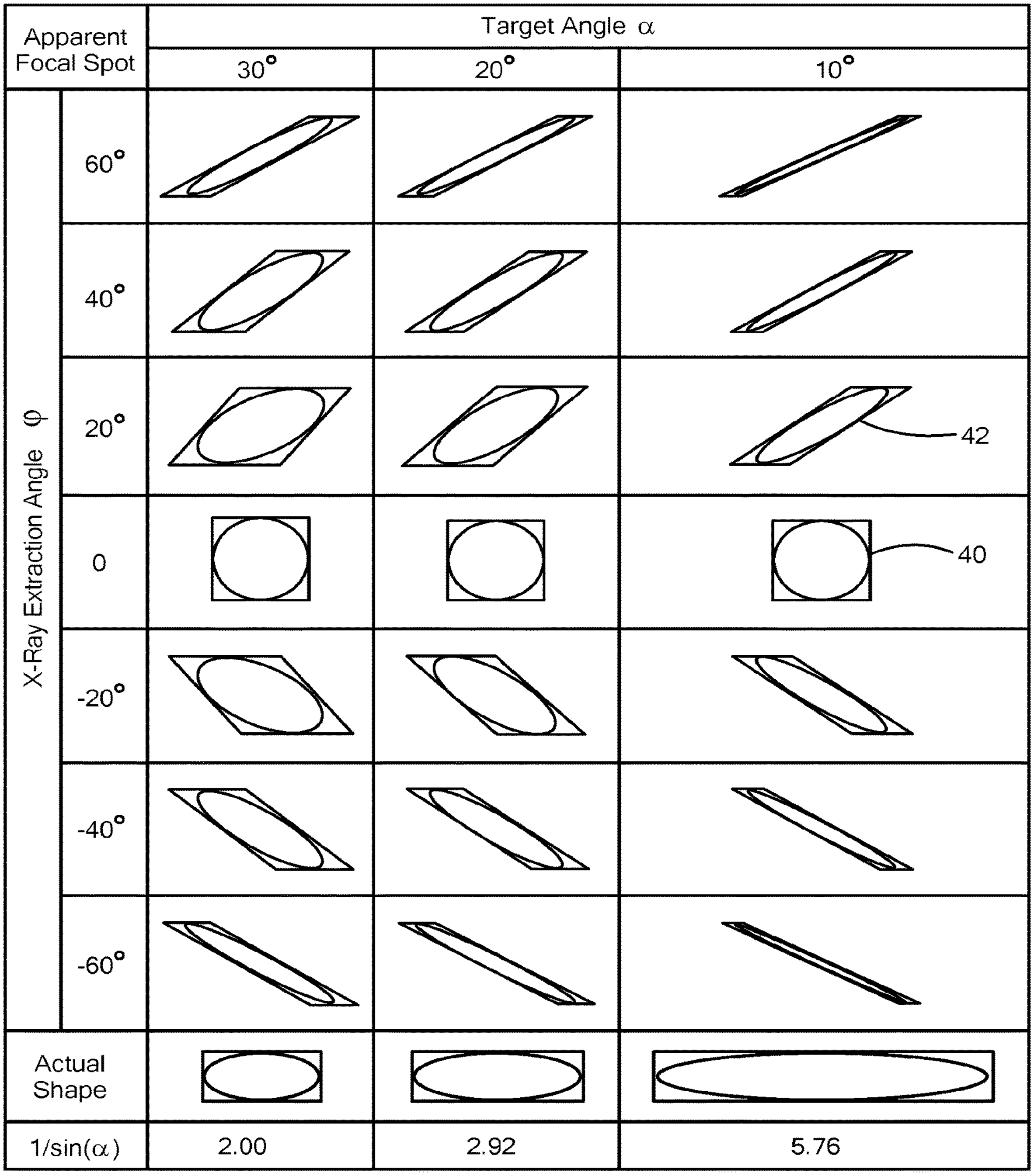
FIG. 4 shows the distortion of the apparent focal spot at various angles $\varphi$ for three target angles $\alpha$.
Figure 5:
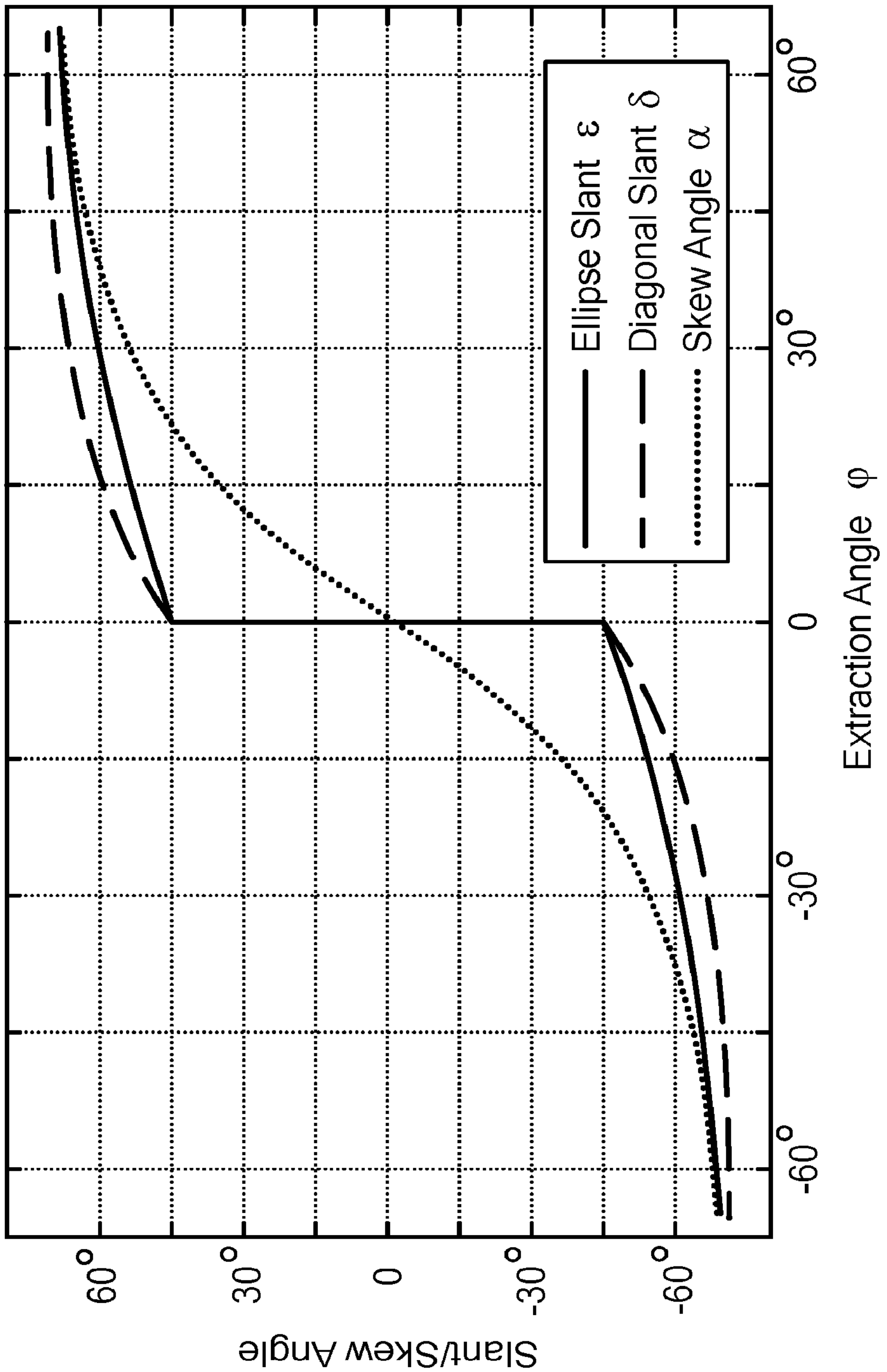
FIG. 5 depicts plots of skew angle σ, slant angle δ of the diagonal, and slant angle ε of the ellipse, as a function of extraction angle φ, in case of a 20° target angle α.
Figure 6A:
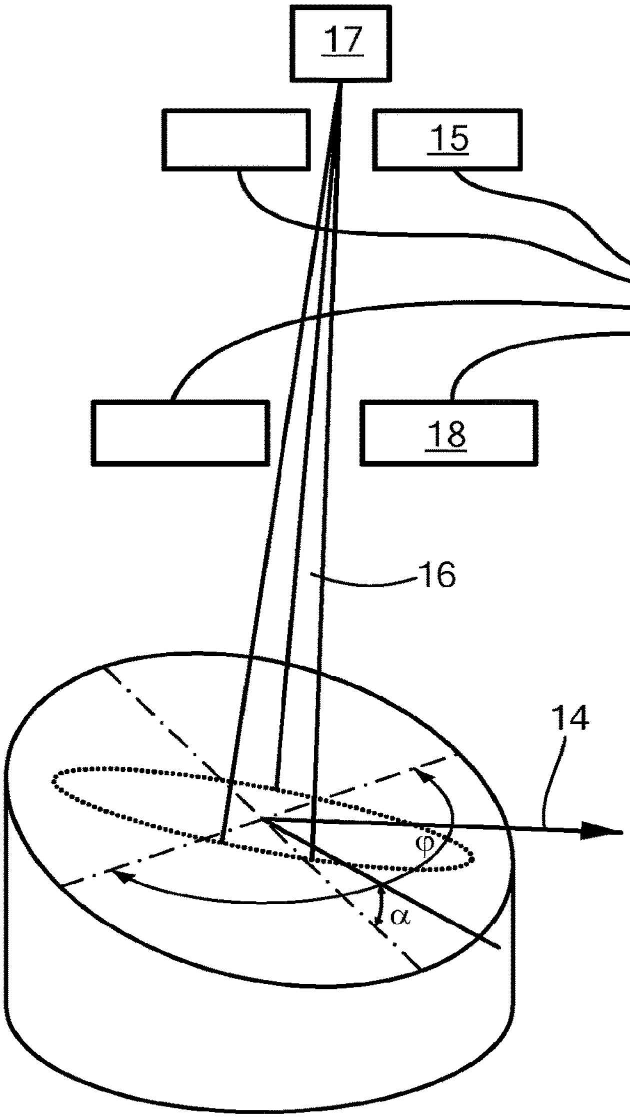
FIGS. 6A and 6B show two views of a target in which the actual focal spot has been adjusted to produce a circular apparent focal spot at the specified extraction angle, in accordance with an embodiment of the present invention.
Figure 6B:
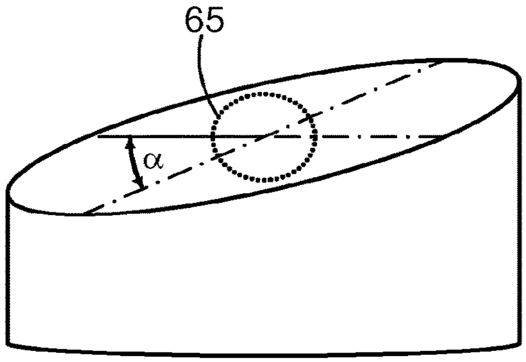

FIGS. 6A and 6B show two views of a target like that depicted in FIG. 1, however the actual focal spot has been adjusted, in accordance with an embodiment of the present invention, to produce a circular apparent focal spot when x-rays are extracted at 45° as shown by the bold arrow in the left view. FIG. 6B is oriented so the x-rays are extracted normal to the page. This is the view through the collimating aperture which shows the apparent focal spot: Dotted ellipse 65 depicts the focal spot seen with the desired circular shape.

In FIG. 6A, beam-focusing element 15 and stigmation elements 18 are shown for controlling shape, size and orientation of electron beam 16 onto target 10. Focusing and stigmation of beam 16 is governed by controller 20, which applies voltages and/or currents to focusing element 15 and stigmation elements 18 as well-known in the art of charged particle beams. Control of beam focus and orientation is taught in detail in Orloff (ed.), *Handbook of Charged Particle Optics* (CRC Press, 2008), and in references cited therein.

Figure 7:
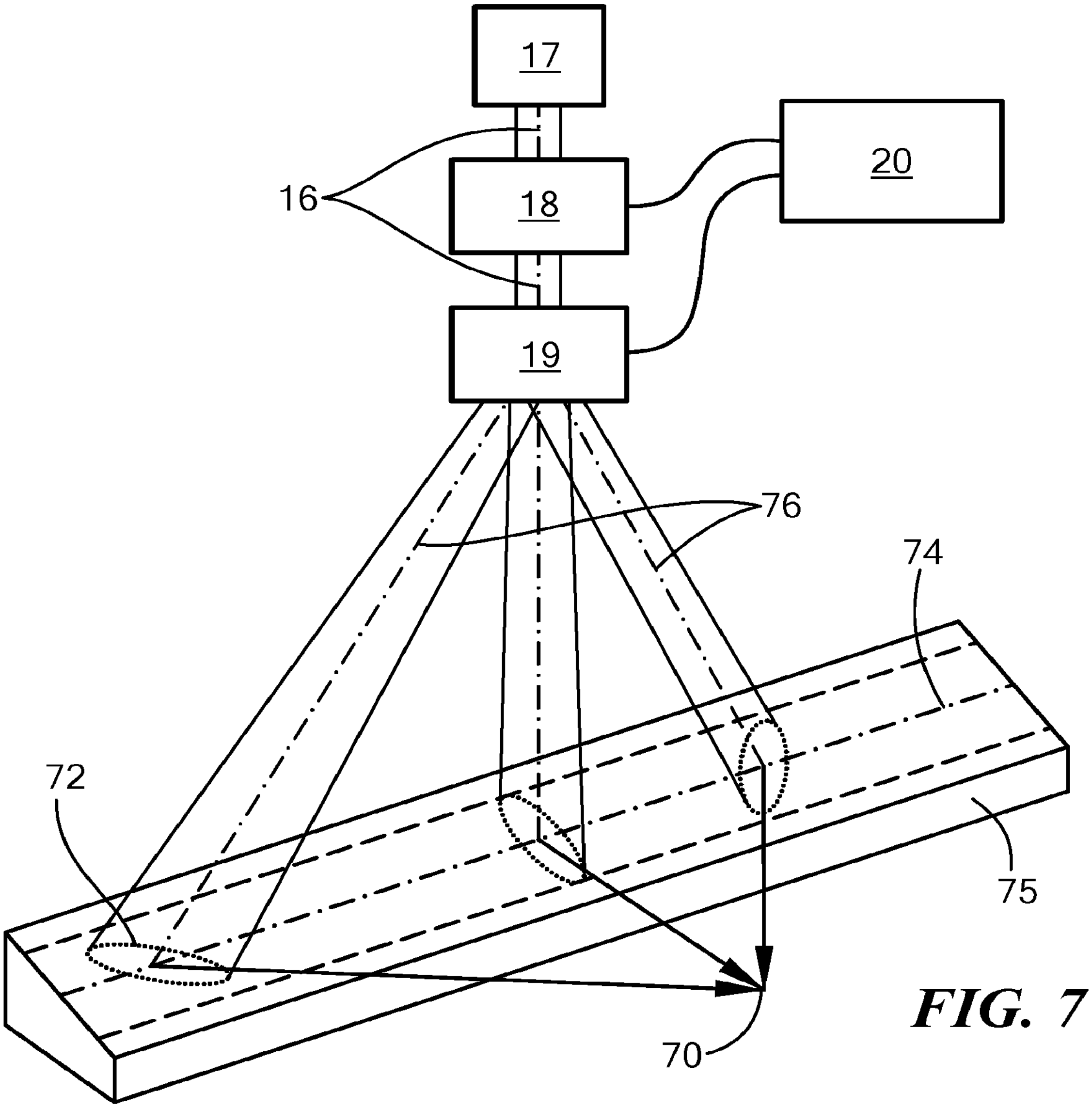
FIGS. 7 and 8 show dynamic focal spot adjustment for extraction angles of φ=(−50°, 0, and 35°), for the case of a beam scanned along a path on a target.
Figure 8:
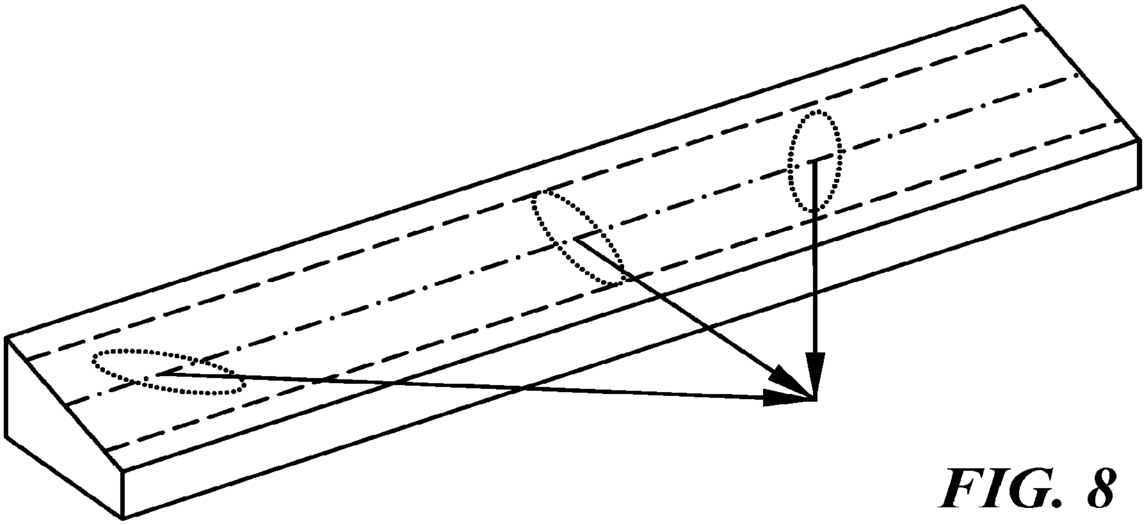

The idea of keeping the elongated actual focal spot aligned with the collimating aperture can also be applied to pencil beam systems with stationary aperture and moving x-ray sources like the one described in U.S. Pat. No. 4,045,672 to Watanabe. For these systems keeping the focal spot orientation and the x-ray extraction angle aligned becomes simple as both are controlled electronically. This is illustrated in FIG. 7 where the same controller 20 drives the beam-focusing and stigmation elements 18 as well as the beam steering elements 19. Both, FIGS. 7 and 8 show dynamic focal spot adjustment for 3 representative extraction angles φ(−50°, 0, and35°) which arise as an electron beam is scanned linearly, in this example, along a path 74 on the face of a bremsstrahlung target 75. In particular, the centroid of the focal spot on the target may vary as a function of time. The point 70 where the three arrows meet is the location of the collimating aperture, which is stationary for a pencil beam system with a moving x-ray source. In FIG. 7 focal spot 72 is merely rotated. Again, that the minor axis of the now elliptical apparent focal spot shrinks as φ increases is not detrimental to imaging, rather the opposite.

In FIG. 8, the focal spot adjustment includes the stretching factor 1/cos (φ) resulting in a round apparent focal spot for all angles φ.

Where examples presented herein involve specific combinations of method acts or system elements, it should be understood that those acts and those elements may be combined in other ways to accomplish the same objectives of beam shaping for inspection with penetrating radiation. Additionally, single device features may fulfill the requirements of separately recited elements of a claim. The embodiments of the invention described herein are intended to be merely exemplary; variations and modifications will be apparent to those skilled in the art. All such variations and modifications are intended to be within the scope of the present invention as defined in any appended claims.

We claim:

1. A method for maintaining a specified beam profile of an x-ray beam extracted from an x-ray target over a large range of extraction angles relative to said target, the method comprising:

generating a beam of electrons;

directing the beam of electrons, characterized by a cross-section, toward a target at an angle of incidence with respect to the target wherein the beam of electrons forms a focal spot corresponding to the cross-section of the electron beam;

dynamically varying at least one of a size, shape, and orientation of the electron beam cross-section as an extraction angle is varied such that a size or shape of an apparent focal spot, defined as a projection of the focal spot on a plane transverse to a direction of extraction of an x-ray beam from the target, is kept substantially invariant with increasing extraction angles; and collimating the x-ray beam extracted at the extraction angle.

2. A method in accordance with claim 1, wherein the step of dynamically varying at least one of the size, shape, and orientation of the electron beam cross-section employs focusing and stigmator coils.

3. A method in accordance with claim 1, wherein the apparent focal spot is controlled in size, shape, and orientation as a function of the extraction angle.

4. A method in accordance with claim 1, further comprising varying an angle of incidence of the beam of electrons during generation of x-rays.

5. A method in accordance with claim 1, further comprising varying a centroid of the focal spot on the target as a function of time.

6. A method in accordance with claim 1, wherein focal spot adjustments are functionally related to beam deflection.

7. A method in accordance with claim 1, further comprising using a collimating aperture to collimate the x-ray beam extracted at the extraction angle and controlling an orientation of the electron beam cross section so that the focal spot on the target aligns with the collimating aperture.

8. A method in accordance with claim 1, further comprising adjusting the electron beam cross-section such that the size and the shape of the apparent focal spot does not vary as a function the extraction angles.

9. A method in accordance with claim 1, wherein said dynamically varying at least one of the size, shape, and orientation of the electron beam cross-section yields a dynamic adjustment of the focal spot and wherein said dynamic adjustment of the focal spot maintains alignment of an actual focal spot with an aperture used to collimate the x-ray beam.

10. A method in accordance with claim 9, wherein said dynamically varying at least one of the size, shape, and orientation of the electron beam cross-section and said dynamic adjustment of the focal spot are achieved without any moving parts inside a vacuum tube generating said x-ray beam.

11. A method in accordance with claim 1, further comprising varying an angle of incidence of the beam of electrons during generation of x-rays.

12. A method in accordance with claim 1, further comprising varying a centroid of the focal spot on the target as a function of time.

13. A method in accordance with claim 1, wherein focal spot adjustments are functionally related to beam deflection.

14. In an x-ray system comprising a vacuum tube with a source of a beam of electrons and a target, a method for maintaining a specified beam profile of an x-ray beam extracted from the target over a large range of extraction angles relative to said target, the method comprising:

generating a beam of electrons from said source;

directing the beam of electrons, characterized by a cross-section, toward a target at an angle of incidence with respect to the target wherein the beam of electrons forms a focal spot corresponding to the cross-section of the electron beam;

dynamically adjusting a focal spot by dynamically varying at least one of a size, shape, and orientation of the electron beam cross-section as an extraction angle is varied such that an apparent focal spot, defined as a projection of the focal spot on a plane transverse to a direction of extraction of an x-ray beam from the target, is controlled in size, shape, and orientation as a function of the extraction angle; and using an aperture to collimate the x-ray beam extracted at the extraction angle.

15. A method in accordance with claim 14, wherein said dynamic adjustment of the focal spot maintains alignment of an actual focal spot with said aperture.

16. A method in accordance with claim 14, wherein said dynamically varying at least one of the size, shape, and orientation of the electron beam cross-section and said dynamically adjusting the focal spot are achieved without any moving parts inside the vacuum tube.

17. A method in accordance with claim 14, wherein the step of dynamically varying at least one of the size, shape, and orientation of the electron beam cross-section employs at least one of focusing and stigmator coils.

18. A method in accordance with claim 14, wherein the apparent focal spot is kept substantially invariant with increasing extraction angles.

* * * * *